United States Patent
Jackson et al.

(10) Patent No.: US 9,405,433 B1
(45) Date of Patent: Aug. 2, 2016

(54) EDITING ELEMENT ATTRIBUTES OF A DESIGN WITHIN THE USER INTERFACE VIEW, AND APPLICATIONS THEREOF

(75) Inventors: Preston Jackson, Longmont, CO (US); John Bacus, Boulder, CO (US); Brian Brown, Longmont, CO (US); Patrick Lacz, Boulder, CO (US); Paul McLean, Denver, CO (US); Jeffrey Hauswirth, Westminster, CO (US)

(73) Assignee: Trimble Navigation Limited, Sunnyvale, CA (US)

( * ) Notice: Subject to any disclaimer, the term of this patent is extended or adjusted under 35 U.S.C. 154(b) by 130 days.

(21) Appl. No.: 12/986,756

(22) Filed: Jan. 7, 2011

(51) Int. Cl.
| | |
|---|---|
| *G06F 3/048* | (2013.01) |
| *G06F 3/00* | (2006.01) |
| *G06F 3/0481* | (2013.01) |
| *G06F 3/0482* | (2013.01) |
| *G06F 3/0483* | (2013.01) |
| *H04N 5/445* | (2011.01) |
| *G06F 9/44* | (2006.01) |

(52) U.S. Cl.
CPC .......... *G06F 3/04817* (2013.01); *G06F 3/0481* (2013.01); *G06F 3/0482* (2013.01); *G06F 3/0483* (2013.01); *G06F 9/4443* (2013.01); *H04N 5/44543* (2013.01)

(58) Field of Classification Search
CPC . G06F 3/0482; G06F 3/0481; G06F 3/04817; G06F 9/4443; H04N 5/44543; G06Q 10/10
USPC ......................................... 715/810, 764, 853
See application file for complete search history.

(56) References Cited

U.S. PATENT DOCUMENTS

| | | | |
|---|---|---|---|
| 5,396,590 | A | 3/1995 | Kreegar |
| 5,729,673 | A | 3/1998 | Cooper et al. |
| 5,986,670 | A | 11/1999 | Dries et al. |
| 6,002,399 | A | 12/1999 | Haine et al. |

(Continued)

OTHER PUBLICATIONS

FunctionX, Inc., Studio Object: Properties Window, published May 12, 2008, pp. 1-4.*

(Continued)

*Primary Examiner* — Amy Ng
*Assistant Examiner* — Erik Stitt
(74) *Attorney, Agent, or Firm* — Sheridan Ross P.C.

(57) ABSTRACT

Systems, methods and articles of manufacture for editing element attributes of a design within a user interface view are described herein. Embodiments of the present invention relate to reducing or eliminating the effort a user must put forth in editing attributes of a user specified element in moving from the user specified element in a main document window of the user interface to the far end of the main document window and then combing within a dense menu displaying every attribute for every element supported by the user interface. Further embodiments allow a user to easily filter through the dense menu displaying every attribute for every element to find the attributes that are specific to the element selected and do so without having to go to the dense menu displayed on the far side of the main document window. In one embodiment, this is achieved by displaying only the attributes specific to the user selected element in a user interactive palette where the user interactive palette is displayed in close proximity to the user selected element in the main document window. Each time a user selects an element a different user interactive palette will appear displaying the attributes specific to the user selected element and in close proximity to that element.

17 Claims, 7 Drawing Sheets

(56) References Cited

U.S. PATENT DOCUMENTS

| | | | |
|---|---|---|---|
| 6,014,127 A | 1/2000 | Blomqvist | |
| 6,128,631 A | 10/2000 | Wallace et al. | |
| 6,133,946 A * | 10/2000 | Cavallaro et al. | 348/135 |
| 6,366,293 B1 * | 4/2002 | Hamilton et al. | 345/649 |
| 6,426,745 B1 | 7/2002 | Isaacs et al. | |
| 6,448,964 B1 | 9/2002 | Isaacs et al. | |
| 6,701,513 B1 * | 3/2004 | Bailey | 717/109 |
| 6,781,597 B1 | 8/2004 | Vrobel et al. | |
| 6,912,293 B1 | 6/2005 | Korobkin | |
| 6,915,301 B2 * | 7/2005 | Hirsch | 717/100 |
| 7,092,859 B2 | 8/2006 | Wang et al. | |
| 7,096,465 B1 | 8/2006 | Dardinski et al. | |
| 7,098,933 B1 | 8/2006 | Thoemmes et al. | |
| 7,110,005 B2 | 9/2006 | Arvin et al. | |
| 7,302,650 B1 | 11/2007 | Allyn et al. | |
| 7,475,000 B2 | 1/2009 | Cook et al. | |
| 7,496,852 B2 | 2/2009 | Eichorn et al. | |
| 7,561,164 B2 | 7/2009 | Baumberg | |
| 7,810,025 B2 | 10/2010 | Blair et al. | |
| 8,132,115 B2 * | 3/2012 | Beltran et al. | 715/763 |
| 8,229,715 B1 | 7/2012 | Teller et al. | |
| 8,487,889 B2 | 7/2013 | King | |
| 8,713,519 B2 | 4/2014 | Lininger | |
| 2001/0018644 A1 | 8/2001 | Schwalb et al. | |
| 2002/0018061 A1 | 2/2002 | Gantt | |
| 2002/0143829 A1 | 10/2002 | Rank et al. | |
| 2003/0206169 A1 | 11/2003 | Springer et al. | |
| 2004/0175684 A1 | 9/2004 | Kaasa et al. | |
| 2004/0177085 A1 | 9/2004 | Rappaport et al. | |
| 2005/0068290 A1 | 3/2005 | Jaeger | |
| 2005/0102063 A1 | 5/2005 | Bierre | |
| 2006/0043264 A1 | 3/2006 | Sakurai | |
| 2006/0064674 A1 | 3/2006 | Olson, Jr. et al. | |
| 2006/0174568 A1 | 8/2006 | Kinoshita et al. | |
| 2006/0242164 A1 * | 10/2006 | Evans et al. | 707/100 |
| 2007/0084861 A1 | 4/2007 | Epstein et al. | |
| 2008/0059914 A1 | 3/2008 | Allyn et al. | |
| 2008/0086701 A1 * | 4/2008 | Stokes et al. | 715/808 |
| 2009/0256846 A1 | 10/2009 | Zahariev | |
| 2010/0079493 A1 | 4/2010 | Tse et al. | |
| 2010/0121614 A1 | 5/2010 | Reghetti et al. | |
| 2010/0149091 A1 | 6/2010 | Kota et al. | |
| 2010/0149189 A1 | 6/2010 | Kota et al. | |
| 2010/0149192 A1 | 6/2010 | Kota et al. | |
| 2010/0149215 A1 | 6/2010 | Kota et al. | |
| 2010/0153692 A1 | 6/2010 | Kota et al. | |
| 2010/0321391 A1 | 12/2010 | Rubin et al. | |
| 2010/0321407 A1 | 12/2010 | Mital et al. | |
| 2012/0030612 A1 * | 2/2012 | Aziz et al. | 715/781 |
| 2012/0262458 A1 | 10/2012 | Fowler et al. | |
| 2012/0323535 A1 | 12/2012 | Teller et al. | |
| 2013/0055125 A1 | 2/2013 | Jackson et al. | |
| 2013/0055126 A1 | 2/2013 | Jackson et al. | |

OTHER PUBLICATIONS

Microsoft.com MSDN, Preparing your Visual Basic 6.0 Applications for the upgrade to Visual Basic. Net, MSDN, Oct. 2000, pp. 1-31.*

Berndt et al., "3D Modeling in a Web Browser to Formulate Content-Based 3D Queries," Web 3D 2009 Proceedings of the 14th International Conference on 3D Web Technology, 2009, 8 pages.

Sandee Cohen, "Visual QuickStart Guide Fireworks 4 for Windows and Macintosh," 2001, 7 pages, fireworks4.pdf.

International Search Report and Written Opinion for International (PCT) Patent Application No. PCT/US2012/049556 mailed Oct. 29, 2012, 8 pages.

U.S. Appl. No. 13/030,276, filed Feb. 18, 2011, Jackson et al.

International Preliminary Report on Patentability for International (PCT) Patent Application No. PCT/US2012/049556 mailed Feb. 13, 2014, 6 pages.

International Search Report for International (PCT) Patent Application No. PCT/US2012/050906, mailed Oct. 29, 2012 3 pages.

International Preliminary Report on Patentability for International (PCT) Patent Application No. PCT/US2012/050906, mailed Mar. 6, 2014 6 pages.

International Search Report for International (PCT) Patent Application No. PCT/US2012/050898, mailed Jan. 31, 2013 3 pages.

International Preliminary Report on Patentability for International (PCT) Patent Application No. PCT/US2012/050898, mailed Mar. 6, 2014 8 pages.

Official Action for U.S. Appl. No. 13/030,276, mailed Mar. 10, 2014 24 pages.

Official Action for U.S. Appl. No. 13/030,276, mailed Aug. 20, 2014 29 pages.

Official Action for U.S. Appl. No. 13/197,976 mailed May 22, 2013, 23 pages.

Notice of Allowance for U.S. Appl. No. 13/197,976 mailed Dec. 6, 2013, 11 pages.

Official Action for U.S. Appl. No. 13/214,962, mailed Jan. 4, 2013 18 pages.

Official Action for U.S. Appl. No. 13/214,962, mailed Jun. 4, 2013 40 pages.

Official Action for U.S. Appl. No. 13/214,962, mailed Jun. 6, 2014 25 pages.

Official Action for U.S. Appl. No. 13/214,984, mailed Jun. 17, 2014 9 pages.

Notice of Allowance for U.S. Appl. No. 13/030,276, mailed Jan. 26, 2015 9 pages.

Official Action for U.S. Appl. No. 13/214,962, mailed Jan. 5, 2015 27 pages.

Official Action for U.S. Appl. No. 13/214,984, mailed Jan. 12, 2015 10 pages.

Notice of Allowance for U.S. Appl. No. 13/214,984, mailed May 22, 2015 7 pages.

"Keynote User's Guide," Apple Computer, Inc., Jan. 2003, 100 pages [retrieved from: https://manuals.info.apple.com/MANUALS/0/MA526/en_US/Keynote_UserGuide.pdf].

Haugland "OpenOffice.org Training, Tips, and Ideas: Diagrams," OpenOffice.org, Jul. 7, 2008, 70 pages [retrieved from: http://openoffice.blogs.com/openoffice/diagrams].

lynda.com "lynda.com: OpenOffice.org 2 Draw Getting Started," lynda.com, Oct. 21, 2008, 1 page [retrieved from https://www.youtube.com/watch?v=Ccx0M49c80c].

Paine "Defining Excel Functions without Visual Basic, by Compiling Function Definition Sheets to VBA," Dr. Dobb's Bloggers, Jul. 15, 2009, 8 pages [retrieved from: http://www.drdobbs.com/architecture-and-design/defining-excel-functions-without-visual/228701714].

Extended Search Report for European Patent Application No. 12820811.3, dated May 26, 2015 7 pages.

Extended Search Report for European Patent Application No. 12826160.9, dated Aug. 4, 2015 7 pages.

Extended Search Report for European Patent Application No. 12826143.5, dated Apr. 14, 2015 7 pages.

* cited by examiner

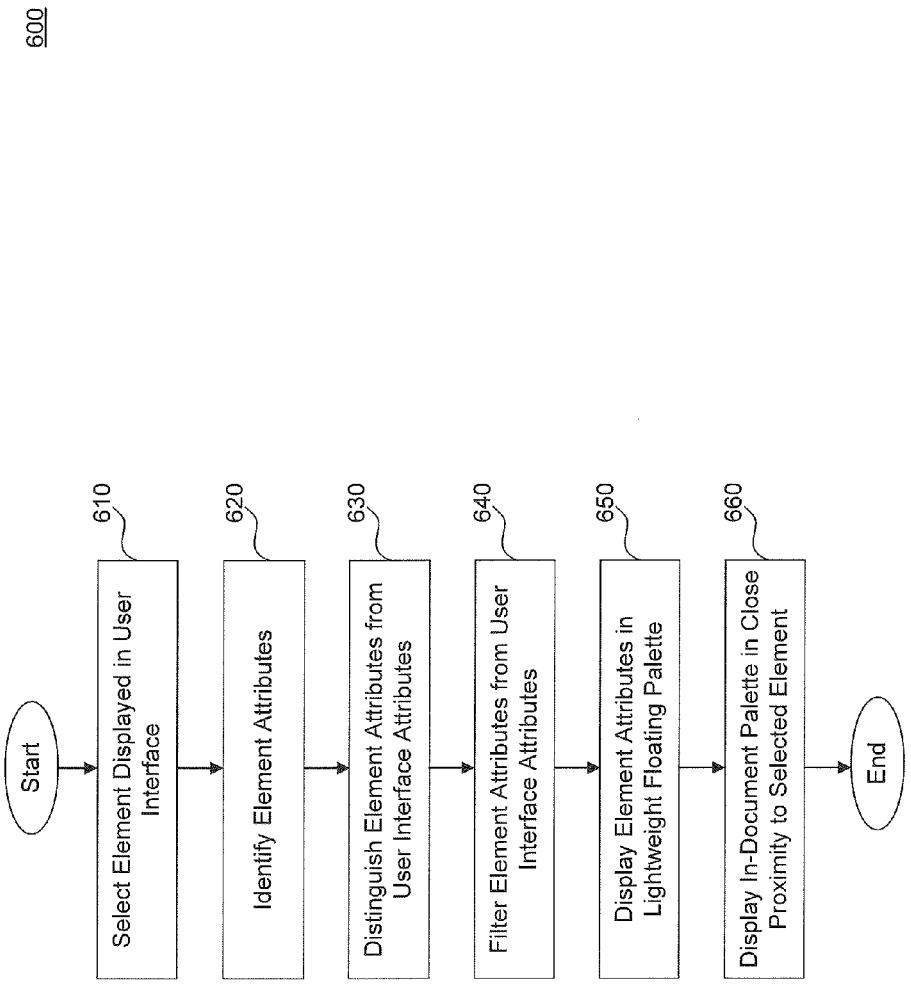

EDITING ELEMENT ATTRIBUTES OF A DESIGN WITHIN THE USER INTERFACE VIEW, AND APPLICATIONS THEREOF

FIELD

The field generally relates to computer drafting tools operating through user interfaces and applications thereof.

BACKGROUND

In a computer aided design (CAD) interface, drafting applications provide a user an ability to draft designs that are displayed and drawn through the CAD interface. The user drafts designs by piecing together elements drawn by the user in the CAD interface. In many instances, each element drawn by the user possesses several attributes that may be edited and modified by the user. In editing the attribute, the user edits the element. Each attribute includes varied metadata so when the user edits an attribute, the user is actually editing the varied metadata included by the attribute.

Editing the attributes of the elements drawn by a user may require the user to comb within a detailed attribute menu where the attribute menu displays every attribute for every element supported by the CAD interface. The detailed attribute menu is displayed in a side view located on the far side the CAD interface display. The user must move from the element that the user wishes to edit displayed in the main document window of CAD all the way to the detailed attribute menu on the far side of the CAD interface display. The user must then comb within the detailed attribute menu to find the attribute the user wishes to edit for the selected element. In some cases, the display of unnecessary attributes that do not exist for the element that the user wishes to edit forces the user to comb within all of the unnecessary attributes displayed on the attribute menu only to finally discover the attributes relevant for the element selected.

BRIEF SUMMARY

Embodiments of the present invention relate to editing capabilities of computer drafting tools. In a first embodiment, a computer implemented method includes the steps for providing a user interface a capability to edit a design that includes at least one element with several attributes. The element is displayed in a drafting window on the user interface. A selection is received from a user that specifies a position on the element. The attributes for the element are filtered based on the position selected by the user on the element resulting in a subset of attributes for the element. The subset of attributes are displayed in the user interface allowing the user to edit the subset of attributes.

In a second embodiment, a system provides a user interface the capability to edit a design that includes at least one element with several attributes. A display module displays the element on a drafting window on the user interface. A receiving module receives a selection from a user that specifies a position on the element. A filtering module filters the plurality of attributes for the element based on the position selected by the user to determine a subset of attributes. The display module displays the subset of attributes on the user interface to enable the user to edit the subset of attributes.

Further embodiments, features, and advantages, as well as the structure and operation of the various embodiments, are described in detail below with reference to the accompanying drawings.

BRIEF DESCRIPTION OF THE DRAWINGS/FIGURES

Embodiments are described with reference to the accompanying drawings. In the drawings, like reference numbers may indicate identical or functionally similar elements.

FIG. 6 illustrates a flowchart illustrating an exemplary aspect of operation, according to one embodiment.

DETAILED DESCRIPTION

A user interface may provide a capability to filter a detailed list of attributes for elements that may be drawn in the user interface so that only the attributes specific to a selected element are displayed in close proximity to the selected element displayed in the user interface. In the Detailed Description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic may be described in connection with an embodiment, it may submitted that it may be within the knowledge of one skilled in the art to effect such feature, structure, or characteristic in connection with other embodiments whether or not explicitly described.

Conventional Approaches

Figure 1A:
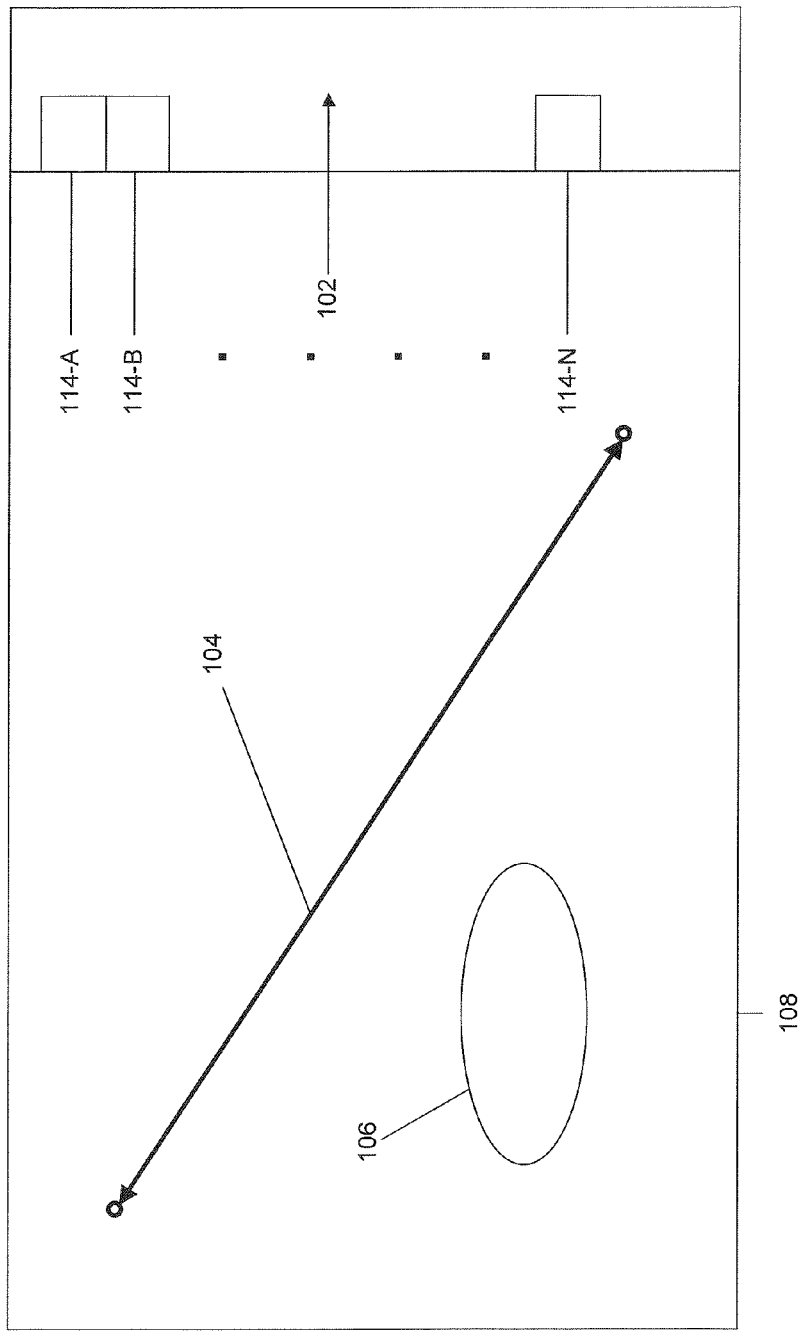
FIG. 1A illustrates a conventional display of the detailed attribute menu on the side of the CAD interface display.

FIG. 1A is an example of a conventional user interface 100, e.g. a CAD interface, that displays a detailed attribute menu on a side of the CAD interface display according to an embodiment. User interface 100 includes one or more elements, a line with arrowheads 104, an ellipse 106, that may be displayed in a main document window 108 of user interface 100. Although FIG. 1A displays two types of elements in a line with arrowheads 104 and an ellipse 106, it is within the knowledge of one skilled in the art to recognize that other elements are within the scope of this invention. Other types of elements can include polylines, bezier curves, images, 3D models, and text blocks.

In an embodiment, main document window 108 of user interface 100 may be a single CAD session where a user may be working in a single CAD window. Each of the elements 104, 106 may be drafted by the user by the user interface 100. A combination of elements 104, 106 can be drafted by the user to build designs that are included in the combination of elements 104, 106.

Once the designs have been drafted by the user, the user selects at least one element 104 that the user wishes to edit.

Each of the elements 104, 106 may be included in a subset of attributes that may be specific characteristics for each individual element 104, 106, e.g. line color. If the user wishes to edit the subset of attributes for element 104, 106, the user must select element 104 on main document window 108 of user interface 150. The user must comb within a detailed attribute menu 102. Detailed attribute menu 102 may be a stationary context menu that displays a plurality of user interface attributes 114 A-N. The plurality of user interface attributes 114 A-N, where N may be an integer greater than 1, encompasses every attribute for all elements 104, 106 available to the user by CAD interface system 100 rather than displaying only the attributes which apply to user selected element 104. Once the user has discovered each attribute that may be a part of the attributes specific to user selected element 104, the user can then proceed to edit those attributes for selected element 104.

Filtered Attributes

Figure 1B:
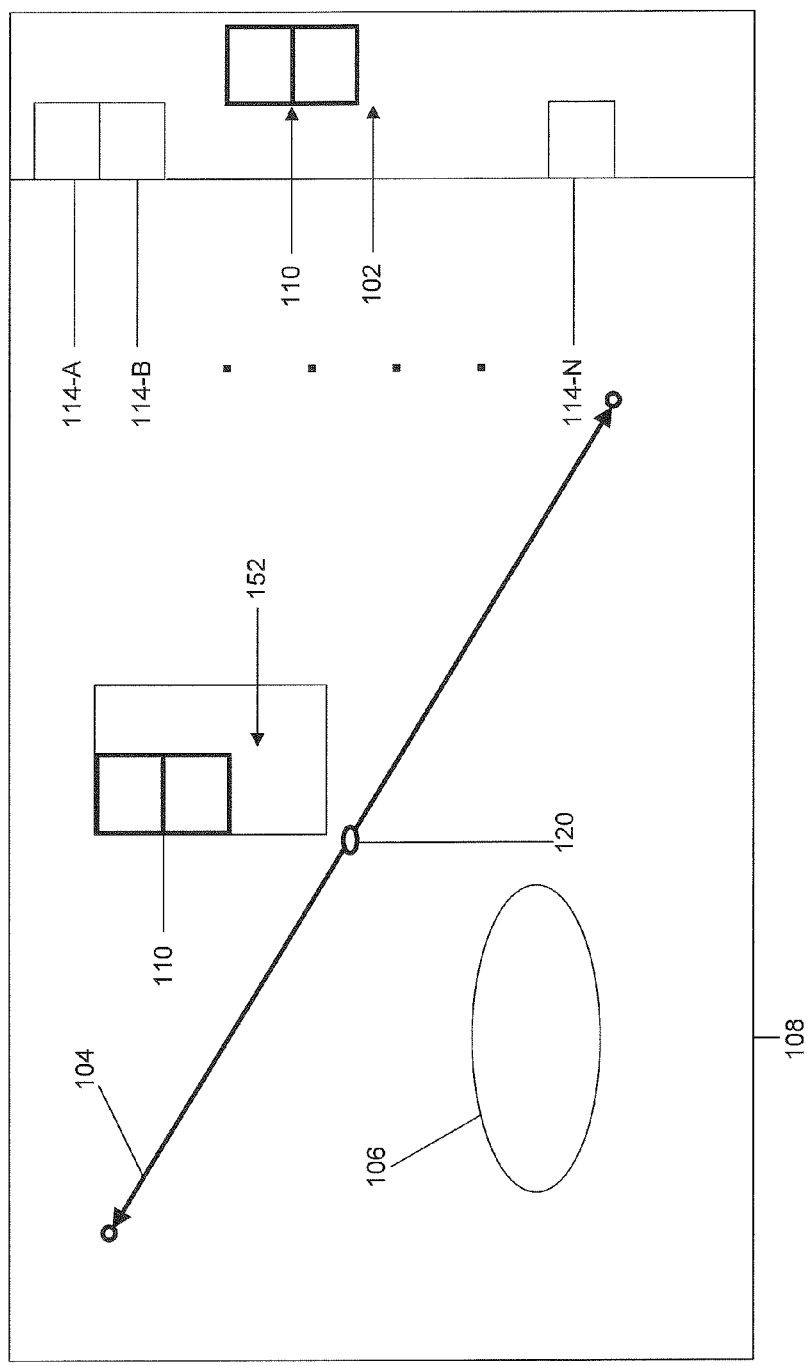
FIG. 1B illustrates a CAD interface distinguishing from the prior art displaying an attribute menu positioned and filtered accordingly and a user selected element, according to an embodiment.

FIG. 1B illustrates a user interface 150, e.g. a CAD interface, distinguishing from the prior art in FIG. 1A where FIG. 1B displays an attribute menu positioned and filtered accordingly and a user selected element, according to an embodiment. One or more elements, a line with arrowheads 104, an ellipse 106, are displayed in main document window 108 of user interface 150. Although FIG. 1A displays two types of elements in a line with arrowheads 104 and an ellipse 106, it is within the knowledge of one skilled in the art to recognize that other elements are within the scope of this invention. Other types of elements can include polylines, bezier curves, images, 3D models, and text blocks.

In an embodiment, main document window 108 of the user interface 150 may be a single CAD session where a user may be working in a single CAD window. Each of elements 104, 106 may be drafted by the user in user interface 150. A combination of elements 104, 106 can be drafted by the user to build designs that are included in combination of elements 104, 106.

Once the designs have been drafted by the user, the user selects at least one element 104 that the user wishes to edit. Each of the elements 104, 106 have a subset of attributes 110 that are specific characteristics, e.g. line color for each individual element 104, 106. Each of the specific characteristics equate to a specified value by the user. For example, if the user decides to turn off an attribute, the user changes the value for that attribute by turning the attribute off.

If the user wishes to edit subset of attributes 110 for element 104, the user must specify a position, e.g. position 120 on element 104 on main document window 108 of user interface 150. Position 120 specified by the user on element 104 determines subset of attributes 110 which are specific to position 120 on user selected element 104. For example, if the user is editing an element such as a triangle and then the user selects a line on the triangle, the user would be able to edit attributes associated with the line of the triangle but not attributes associated with the rest of the triangle such as angle dimensions for the triangle. In doing so, plurality of user interface attributes 114 A-N displayed in detailed attribute menu 102 may be filtered down so that only subset of attributes 110 specific to the position 120 of user selected element 104 may be displayed to the user to edit user selected element 104.

In an embodiment, subset of attributes 110 for user selected element 104 may be filtered from plurality of user interface attributes 114 A-N displayed in detailed attribute menu 102. In such an embodiment, only the attributes which are part of subset of attributes 110 based on position 120 specified by the user on element 104 are brightened on detailed attribute menu 102. The subset of attributes 110 that are brightened on detailed attribute menu 102 signifies to the user that only subset of attributes 110 for position 120 on user selected element 104 are active and available to the user. The plurality of user interface attributes 114 A-N that are not part of subset of attributes 110 are dark on detailed attribute menu 102 and inactive to the user.

In an embodiment, subset of attributes 110 for user selected element 104 may be filtered from plurality of user interface attributes 114 A-N displayed in detailed attribute menu 102. In such an embodiment, only the attributes which are part of subset of attributes 110 based on position 120 specified by the user on element 104 are displayed in a palette 152 on main document window 108 of user interface 150. In an embodiment, palette 152 may be an interactive user interface that displays subset of attributes 110 so that the user can edit subset of attributes 110 based on position 120 for user selected element 104. Palette 152 displaying subset of attributes 110 for user selected element 104 may be placed in a close proximity to position 120 specified by the user on element 104. In an embodiment, palette 152 placed in close proximity to position 120 exemplifies that palette 152 may be placed near to position 120 relative to the rest of main document window 108. Placing palette 152 in close proximity to position 120 allows the user to easily edit subset of attributes 110 without having to go another portion of main document window 108 away from user selected position 120 to execute the edits.

Such an embodiment allows the user to easily edit subset of attributes 110 for user selected element 104 because only relevant attributes for user selected element 104 are displayed in close proximity to user selected element 104. The user does not have to move away from position 120 specified by the user on element 104 where palette 152 may be located for easy access to the user. Without palette 152 located in close proximity to position 120 specified by the user on element 104, the user would have to move away from position 120 of element 104 to the far side of main document window 108. The user would have to sift within detailed attribute menu 102 to find subset of attributes 110 for user selected element 104.

In an embodiment, palette 152 displayed on first view 108 of user interface 150 may be a lightweight floating palette 152. In such an embodiment, lightweight floating palette 152 may be an interactive user interface where the user can edit subset of attributes 110 for user selected element 104. In an embodiment, lightweight floating palette 152 can also be an interactive window allowing the user to interact with subset of attributes 110 that are displayed in a user friendly form so that the user can select, edit, turn-on, and turn-off subset of attributes 110 displayed in lightweight floating palette 152. Lightweight floating palette 152 also provides an interactive user interface to the user as opposed to standard context menus. Subset of attributes 110 may be displayed by a combination of text and symbols on lightweight floating palette 152 and not text typical in standard context menus.

Lightweight floating palette 152 displays only subset of attributes 110 for user selected element 104 and appears in close proximity to user selected position 120 on user selected element 104. Since lightweight floating palette 152 may only include subset of attributes 110 necessary for user selected element 104, the user does not experience a delay in drawing upon lightweight floating palette 152 as would be the case for a context menu included in plurality of user interface attributes 114 A-N for all possible elements. Once lightweight floating palette 152 appears to the user in close proximity to position 120 specified by the user, the user has the freedom to move lightweight floating palette 152 throughout main document window 108 of user interface 150.

In an embodiment, the user specifies position 120 on the user selected element 104 by clicking on element 104 located in main document window 108. In doing so, lightweight floating palette 152 appears displaying subset of attributes 110 specific to user selected element 104 in close proximity to user specified position 120 on user selected element 104. In an embodiment, a plurality of elements 104, 106 may be displayed in main document window 108 of user interface 150. The user specifies the position 120 on at least one element 104 where the user can then edit subset of attributes 110 for user selected element 104 by lightweight floating palette 152 displayed in close proximity to user specified position 120.

In an embodiment, plurality of user interface attributes 114 A-N that encompasses every attribute for all elements 104, 106 available to the user by the CAD interface system 150 may be displayed in detailed attribute menu 102 in a second main document window of the CAD interface system 150. The second main document window of CAD interface system 150 may be a second CAD window in a second CAD session. The user has the option to move from the main document window 108 where the user may be editing subset of attributes 110 for selected element 104 by lightweight floating palette 152 to the second main document window to examine plurality of user interface attributes 114 A-N in detailed attribute menu 102.

In an embodiment, plurality of user interface attributes 114 A-N that encompasses every attribute for all elements 104, 106 available to the user by CAD interface system 150 may be displayed in lightweight floating palette 152. Lightweight floating palette 152 displaying the plurality of user interface attributes 114 A-N may be displayed in close proximity to user specified position 120 on user selected element 104.

Examples Exemplifying Filtered Attributes

Figure 2:
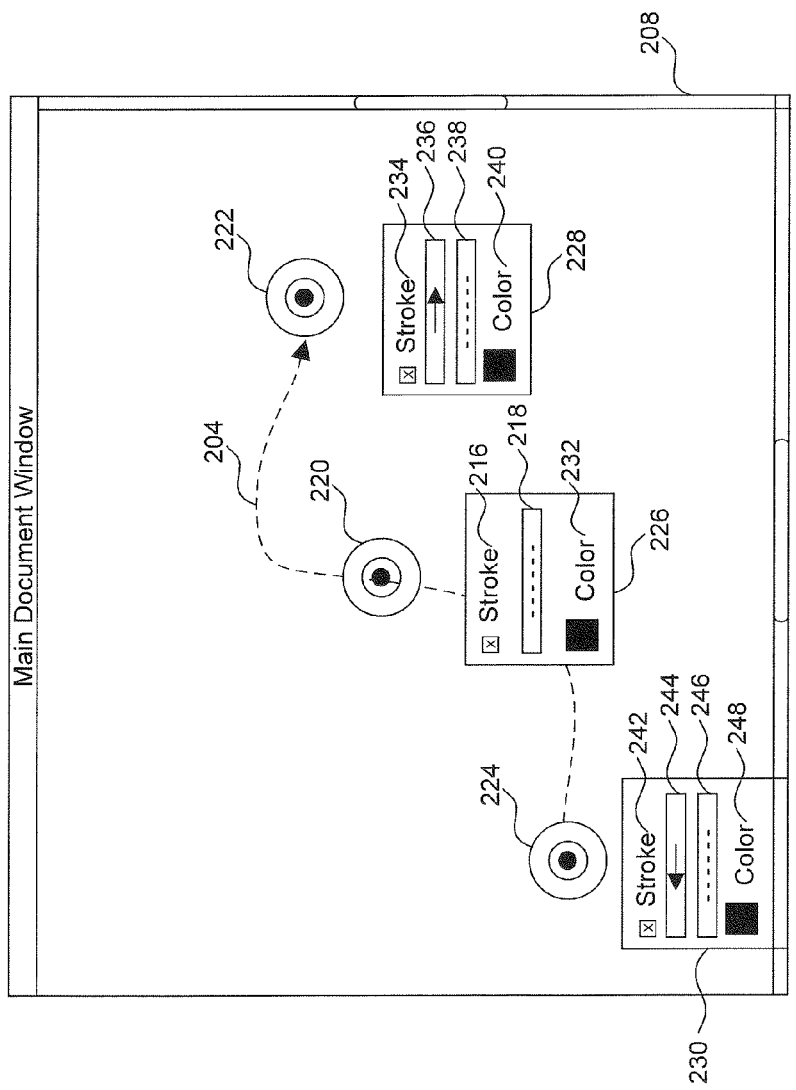
FIG. 2 illustrates a CAD interface displaying a dotted line with an attribute menu for each of the user selected elements, according to one embodiment.

FIG. 2 illustrates a user interface, e.g. a CAD interface system 200, according to an embodiment. The element 104 in FIG. 1B may be represented by a dotted line with an arrowhead 204 in FIG. 2. The user selected position 120 in FIG. 1B may be represented by a midpoint position 220, line end position 222, and line start position 224. The lightweight floating palette 152 displaying the subset of attributes 110 in FIG. 1B may be represented by line start position lightweight floating palette 230, midpoint position lightweight floating palette 226, and line end position lightweight floating palette 228.

In FIG. 2, an element, e.g. a dotted line with an arrowhead 204, may be displayed in a main document window 208 of CAD interface 200. The dotted line with the arrowhead 204 may be drafted by a user by CAD interface 200. The dotted line with the arrowhead 204 may be included in a subset of attributes, e.g. midpoint subset of attributes 216, 218, 232, line end subset of attributes 234, 236, 238, 240, line start subset of attributes 242, 244, 246, 248 that are specific characteristics for the dotted line with the arrowhead 204. If the user wishes to edit the attributes for the dotted line with the arrowhead 204, the user must specify a position, e.g. midpoint position 220, line end position 222, line start position 224 on the dotted line with the arrowhead 204.

A midpoint position 220 allows the user to edit a midpoint subset of attributes 210 that includes attributes specific to the midpoint position 220, e.g. stroke, enable, color, dash pattern, corner style, path type. It is within the knowledge of one skilled in the art to recognize that other attributes are within the scope of this invention. A midpoint position stroke 216 attribute may allow the user to select a value regarding the midpoint position stroke 216. If the user wishes to have the dotted line disappear, the user may change the value of the midpoint position stroke 216 such that the stroke would be turned off and the dotted line would disappear. If the user wishes to have the dotted line displayed, the user may change the value of the midpoint position stroke 216 such that the stroke would be turned on and the dotted line would appear in main document window 208.

A midpoint position dash pattern 218 attribute may allow the user to select a value regarding the midpoint position dash pattern 218. If the user wishes to change the thickness and size of the midpoint position dash pattern 218, the user may change the value of the midpoint position dash pattern 218 such that the midpoint position dash pattern 218 may be changed accordingly to the user's liking. A midpoint position color 232 may allow the user to select a value regarding the color of the dotted line. If the user wishes to change the color of the dotted line, e.g. from black to blue, the user simply changes the value associated with black to the value associated with blue.

A line end position 222 allows the user to edit a line end subset of attributes 242, 244, 246, 248 that includes attributes specific to the line end position 222, e.g. stroke enable, color, arrowhead, dash pattern, end caps. A line end position stroke 234 attribute may allow the user to select a value regarding the line end position stroke 234. If the user wishes to have the arrowhead outlined, the user may change the value of the line end position stroke 234 such that the arrowhead may be outlined. If the user wishes to have the arrowhead to simply be displayed in a color but not outlined, the user may change the value of the line end position stroke 234 such that the arrowhead may be only displayed in a color and not outlined.

A line end position arrowhead 236 attribute may allow the user to select a value regarding the line end position arrowhead 236. If the user wishes to change the size and the style of the line end position arrowhead 236 or to add or delete the line end position arrowhead 236, the user may change the value of the line end position arrowhead 236 such that the line end position arrowhead 236 may be changed accordingly to the user's liking. A line end position arrowhead dash pattern 238 attribute may allow the user to select a value regarding the line end position arrowhead dash pattern 238. If the user wishes to change the outline of the line end position arrowhead 238 from a solid line to a dash pattern, the user may change the value of the line end position arrowhead dash pattern 238 such that the line end position arrowhead dash pattern 238 may be changed accordingly to the user's liking. A line end position arrowhead color 240 may allow the user to select a value regarding the color of the arrowhead. If the user wishes to change the color of the arrowhead, e.g. from black to blue, the user simply changes the value associated with black to the value associated with blue.

A line start position 224 allows the user to edit a line start subset of attributes 234, 236, 238, 240 that includes attributes specific to the start end position 224, e.g. stroke enable, color, dash pattern, end caps. It is within the knowledge of one skilled in the art to recognize that other attributes are within the scope of this invention. A line end position stroke 242 attribute may allow the user to select a value regarding the line end position stroke 242. If the user wishes to have the line start point outlined, the user may change the value of the line start position stroke 234 such that the line start point be outlined. If the user wishes to have the line start point to simply be displayed in a color but not outlined, the user may change the value of the line start position stroke 234 such that the line start point may be only displayed in a color and not outlined.

A line start position arrowhead 244 attribute may allow the user to select a value regarding the line start position arrowhead 244. If the user wishes to change the size and the style of the line end start arrowhead 244 or add or delete the line end start arrowhead 244, the user may change the value of the line start position arrowhead 244 such that the line start position arrowhead 244 may be changed accordingly to the user's liking. A line start position dash pattern 246 attribute may allow the user to select a value regarding the line start position dash pattern 246. If the user wishes to change the outline of the line start position 246 from a solid line to a dash pattern, the user may change the value of the line start position dash pattern 246 such that the line start position dash pattern 246 may be changed accordingly to the user's liking. A line start position color 248 may allow the user to select a value regarding the color of the start point. If the user wishes to change the color of the start point, e.g. from black to blue, the user simply changes the value associated with black to the value associated with blue.

Once the user specifies position 220, 222, 224 on dotted line with arrowhead 204, a lightweight floating palette 226, 228, 230 on main document window 208 of CAD interface system 200 appears displaying subset of attributes 216, 218, 232 in a close proximity to user specified position 220, 222, 224. A midpoint position lightweight floating palette 226 appears in close proximity to user selected midpoint position 220 displaying midpoint subset of attributes 210. A line end position lightweight floating palette 228 appears in close proximity to user selected line end position 222 displaying line end subset of attributes 242, 244, 246, 248. A line start position lightweight floating palette 230 appears in close proximity to user selected line end position 224 displaying line start subset of attributes 234, 236, 238, 240. Such an embodiment allows the user to easily edit the appropriate subset of attributes for the user selected position because only the relevant attributes for the user selected position are displayed in close proximity to the user selected position.

Figure 3:
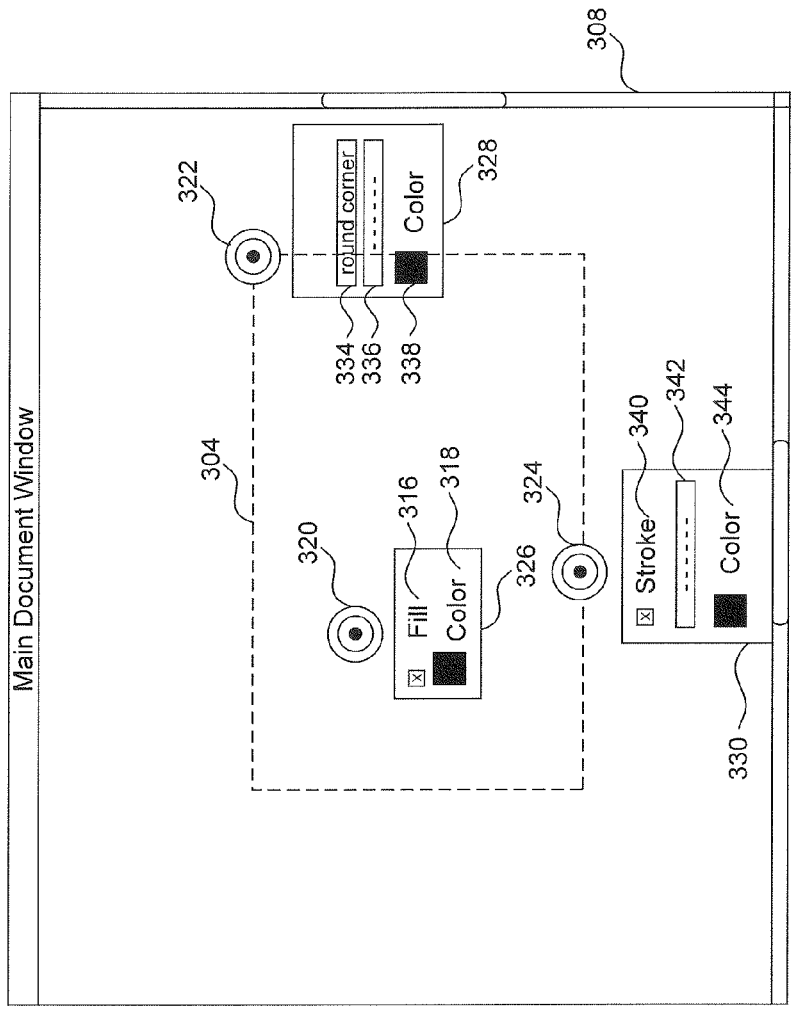
FIG. 3 illustrates a CAD interface displaying a two-dimensional rectangle with an attribute menu for each of the user selected elements, according to one embodiment.

FIG. 3 illustrates a user interface, e.g. a CAD interface system 300, according to an embodiment. The element 104 in FIG. 1B may be represented by a two-dimensional rectangle 304 in FIG. 3. The user selected position 120 in FIG. 1B may be represented by an interior position 320, corner position 322, and perimeter position 324. The lightweight floating palette 152 displaying the subset of attributes 110 in FIG. 1B may be represented by interior position lightweight floating palette 326, corner position lightweight floating palette 328, and perimeter position lightweight floating palette 330.

In FIG. 3 an element, e.g. a two-dimensional rectangle 304 may be displayed in a main document window 308 of the CAD interface system 300. The two-dimensional rectangle 304 may be drafted by a user by the CAD interface system 300. The two-dimensional rectangle 304 may be included in a subset of attributes, e.g. interior subset of attributes 316, 318, corner subset of attributes 334, 336, 338, perimeter subset of attributes 340, 342, 344 that are specific characteristics for the two-dimensional rectangle 304. If the user wishes to edit the attributes for the two-dimensional rectangle, the user must specify a position, e.g. interior position 320, corner position 322, perimeter position 324 on the two-dimensional rectangle 304.

An interior position 320 may allow the user to edit an interior subset of attributes 316, 318 that includes attributes specific to the interior position 320, e.g. fill enable, fill color. It is within the knowledge of one skilled in the art to recognize that other attributes are within the scope of this invention. An interior position fill 316 may allow the user to select a value regarding the fill of the two-dimensional rectangle 304. If the user wishes to have the two-dimensional rectangle 304 filled with a color, the user may change the value of the interior position fill 316 such that the two-dimensional rectangle 304 may be filled accordingly to the user's liking. A interior position color 318 may allow the user to select a value regarding the color of the fill for the two-dimensional rectangle 304. If the user wishes to change the color of the fill for the two-dimensional rectangle 304, e.g. from black to blue, the user simply changes the value associated with black to the value associated with blue.

A corner position 322 allows the user to edit a corner subset of attributes 334, 336, 338 that includes attributes specific to the corner position 322, e.g. stroke enable, stroke color, dash pattern, corner styles. It is within the knowledge of one skilled in the art to recognize that other attributes are within the scope of this invention. A corner position round corner 334 attribute may allow the user to select a value regarding the corner position round corner 334. If the user wishes to round the corner of the two-dimensional rectangle 304 rather than have the corner be pointed, the user may change the value of the corner position round corner 334 such that the corner position round corner 334 may be changed accordingly to the user's liking.

A corner position dash pattern 336 attribute may allow the user to select a value regarding the corner position dash pattern 336. If the user wishes to change the outline of the corner from a solid line to a dash pattern, the user may change the value of the corner position dash pattern 334 such that the corner position dash pattern 334 may be changed accordingly to the user's liking. A corner position color 338 may allow the user to select a value regarding the color of the corner. If the user wishes to change the color of the corner, e.g. from black to blue, the user simply changes the value associated with black to the value associated with blue.

A perimeter position 324 allows the user to edit a perimeter subset of attributes 340, 342, 344 that includes attributes specific to perimeter position 324, e.g. stroke enable, color, dash pattern, end caps. It is within the knowledge of one skilled in the art to recognize that other attributes are within the scope of this invention. It is within the knowledge of one skilled in the art to recognize that other attributes are within the scope of this invention. A perimeter position stroke 340 attribute may allow the user to select a value regarding perimeter position stroke 340. If the user wishes to have the perimeter of two-dimensional rectangle 304 outlined, the user may change the value of perimeter position stroke 340 such that the perimeter may be outlined. If the user wishes to have the perimeter of two-dimensional rectangle 304 to not be outlined, the user may change the value of perimeter position stroke 340 such that two-dimensional rectangle 304 may not be outlined.

A perimeter position dash pattern 342 attribute may allow the user to select a value regarding perimeter position dash pattern 342. If the user wishes to change the outline of two-dimensional rectangle 304 from a solid line to a dash pattern, the user may change the value of perimeter position dash pattern 342 such that the perimeter position dash pattern 342 may be changed accordingly to the user's liking. A perimeter position color 344 may allow the user to select a value regarding the color of the outline around two-dimensional rectangle 304. If the user wishes to change the color of the outline, e.g. from black to blue, the user simply changes the value associated with black to the value associated with blue.

Once the user specifies the position 320, 322, 324 on the two-dimensional rectangle 304, a lightweight floating palette, e.g. interior position lightweight floating palette 326, corner position lightweight floating palette 328, perimeter position lightweight floating palette 330 on main document window 308 of CAD interface system 300 appears in a close proximity to user specified position 320, 322, 324. An interior position lightweight floating palette 326 appears in close proximity to user selected interior position 320 displaying interior subset of attributes 316, 318. A corner position lightweight floating palette 328 appears in close proximity to user selected corner position 322 displaying corner subset of attributes 334, 336, 338. A perimeter position lightweight floating palette 330 appears in close proximity to user selected perimeter position 324 displaying perimeter subset of attributes 340, 342, 344. Such an embodiment allows the user to easily edit the appropriate subset of attributes for the user selected position because only the relevant attributes for the user selected position are displayed in close proximity to the user selected position.

Figure 4:
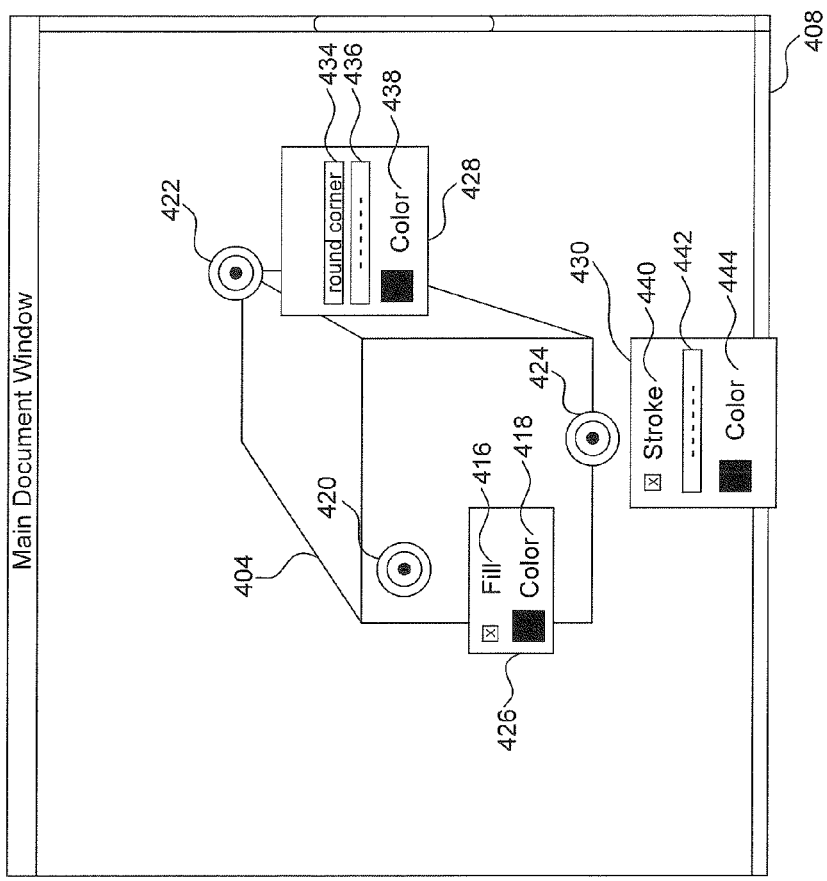
FIG. 4 illustrates a CAD interface displaying a three-dimensional rectangular object with an attribute menu for each of the user selected elements, according to one embodiment.

FIG. 4 illustrates a user interface, e.g. a CAD interface system 400, according to an embodiment. The element 104 in FIG. 1B may be represented by a three-dimensional rectangular prism 404 in FIG. 4. The user selected position 120 in FIG. 1B may be represented by an interior position 420, corner position 422, and perimeter position 424. The lightweight floating palette 152 displaying subset of attributes 110 in FIG. 1B may be represented by interior position lightweight floating palette 426, corner position lightweight floating palette 428, and perimeter position lightweight floating palette 430.

In FIG. 4 an element, e.g. a three-dimensional rectangular prism 404 may be displayed in a main document window 408 of CAD interface system 400. Three-dimensional rectangular prism 404 may be drafted by a user by CAD interface system 400. Three-dimensional rectangular prism 404 may include a subset of attributes, e.g. interior subset of attributes 416, 418, corner subset of attributes 434, 436, 438, perimeter subset of attributes 440, 442, 444, that are specific characteristics for three-dimensional rectangular prism 404. If the user wishes to edit the attributes for the three-dimensional rectangular prism 404, the user must specify a position, e.g. interior position 420, corner position 422, perimeter position 424 on three-dimensional rectangular prism 404.

An interior position 420 allows the user to edit an interior subset of attributes 416, 418 that includes attributes specific to the interior position 420, e.g. fill enable, fill color, texture parameters, volume parameters. It is within the knowledge of one skilled in the art to recognize that other attributes are within the scope of this invention. An interior position fill 416 may allow the user to select a value regarding the fill of three-dimensional rectangular prism 404. If the user wishes to have three-dimensional rectangular prism 404 filled with a color, the user may change the value of interior position fill 416 such that three-dimensional rectangular prism 404 may be filled accordingly to the user's liking. An interior position color 418 may allow the user to select a value regarding the color of the fill for three-dimensional rectangular prism 404. If the user wishes to change the color of the fill for three-dimensional rectangular prism 404, e.g. from black to blue, the user simply changes the value associated with black to the value associated with blue.

A corner position 422 allows the user to edit a corner subset of attributes 434, 436, 438 that includes attributes specific to the corner position 422, e.g. stroke enable, stroke color, dash pattern, corner styles. It is within the knowledge of one skilled in the art to recognize that other attributes are within the scope of this invention. A corner position round corner 434 attribute may allow the user to select a value regarding the corner position round corner 434. If the user wishes to round the corner of three-dimensional rectangular prism 404 rather than have the corner be pointed, the user may change the value of the corner position round corner 434 such that the corner position round corner 434 may be changed accordingly to the user's liking.

A corner position dash pattern 436 attribute may allow the user to select a value regarding the corner position dash pattern 436. If the user wishes to change the outline of the corner from a solid line to a dash pattern, the user may change the value of the corner position dash pattern 434 such that the corner position dash pattern 434 may be changed accordingly to the user's liking. A corner position color 438 may allow the user to select a value regarding the color of the corner. If the user wishes to change the color of the corner, e.g. from black to blue, the user simply changes the value associated with black to the value associated with blue.

A perimeter position 424 allows the user to edit a perimeter subset of attributes 440, 442, 444 that includes attributes specific to the perimeter position 424, e.g. stroke enable, stroke color, dash pattern. It is within the knowledge of one skilled in the art to recognize that other attributes are within the scope of this invention. It is within the knowledge of one skilled in the art to recognize that other attributes are within the scope of this invention. A perimeter position stroke 440 attribute may allow the user to select a value regarding the perimeter position stroke 440. If the user wishes to have the perimeter of three-dimensional rectangular prism 404 outlined, the user may change the value of the perimeter position stroke 440 such that perimeter may be outlined. If the user wishes to have the perimeter of three-dimensional rectangular prism 404 to not be outlined, the user may change the value of the perimeter position stroke 440 such that three-dimensional rectangular prism 404 may not be outlined.

A perimeter position dash pattern 442 attribute may allow the user to select a value regarding perimeter position dash pattern 442. If the user wishes to change the outline of three-dimensional rectangular prism 404 from a solid line to a dash pattern, the user may change the value of perimeter position dash pattern 442 such that perimeter position dash pattern 442 may be changed accordingly to the user's liking. A perimeter position color 444 may allow the user to select a value regarding the color of the outline around three-dimensional rectangular prism 404. If the user wishes to change the color of the outline, e.g. from black to blue, the user simply changes the value associated with black to the value associated with blue.

Once the user specifies the position 420, 422, 424 on three-dimensional rectangular prism 404, a lightweight floating palette, e.g. interior position lightweight floating palette 426, corner position lightweight floating palette 428, perimeter position lightweight floating palette 430 on main document view 408 of the CAD interface system 400 appears in a close proximity to user specified position 420, 422, 424. An interior position lightweight floating palette 426 appears in close proximity to user selected interior position 420 displaying interior subset of attributes 416, 418. A corner position lightweight floating palette 428 appears in close proximity to user selected corner position 422 displaying corner subset of attributes 434, 436, 438. A perimeter position lightweight floating palette 430 appears in close proximity to user selected perimeter position 424 displaying perimeter subset of attributes 440, 442, 444. Such an embodiment allows the user to easily edit the appropriate subset of attributes for the user selected position because only the relevant attributes for the user selected position are displayed in close proximity to the user selected position.

System 500

Figure 5:
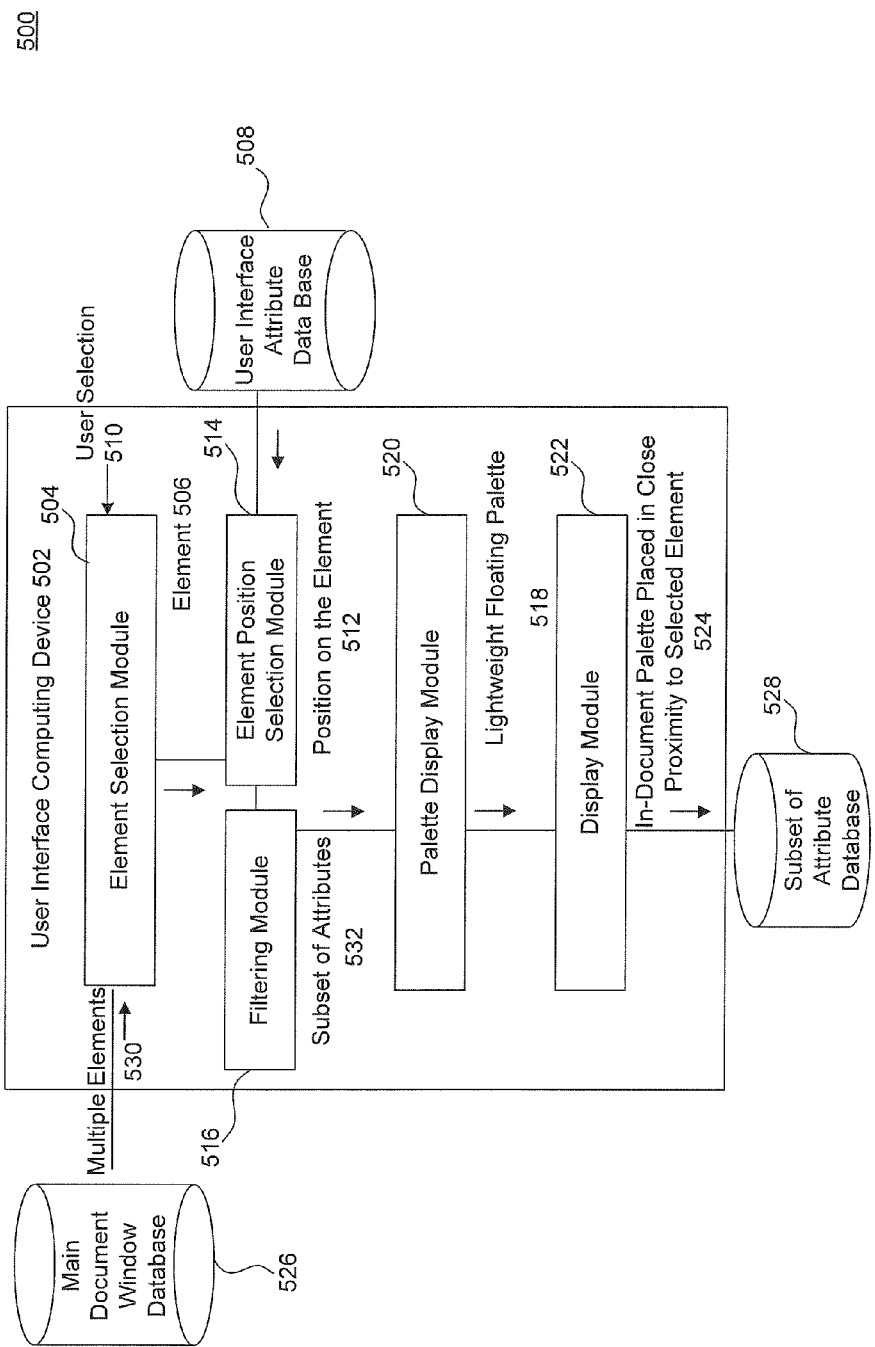
FIG. 5 illustrates a user interface computing system architecture, according to one embodiment.

FIG. 5 is an example database system architecture 500 in which embodiments of the present invention, or portions thereof, may be implemented. System architecture 500 includes user interface computing device 502 coupled to main document window data base 526. User interface computing device 502 may also coupled to user interface attribute database 508 and subset of attribute database 528. While the embodiment of the invention depicted in FIG. 5 shows user interface computing device 502 connected to main document window database 526, user interface attribute database 508, and subset of attribute database 528, it is important to note that embodiments can be used to exchange data between a variety of different types of computer-implemented data sources, systems and architectures.

User interface computing device 502 has element selection module 504 that receives multiple elements 530 and user selection 501. Element position selection module 514 specifies position on the element 512. Filtering module 516 filters out subset of attributes 532. Palette display module 520 displays lightweight floating palette 518. Display module 522 displays the lightweight floating palette in close proximity to selected element 524.

In general, user interface computing system 502 operates as follows. Main document window database 526 supplies a source of multiple elements 530 that encompass all of the elements that user interface computing system 502 makes available to the user. The user activates element selection module 504 that selects from multiple elements 530 displayed in main document window 108 a user selection 501. User selection 501 may be at least one element from the multiple elements 530 displayed in the main document window 108 that the user wishes to edit.

Element position selection module 512 identifies a position on the element 512 that the user specified. In an embodiment, the user selects the position on the element 512 by the element position selection module 514 where the user specifies the position on the element 512 by clicking on the specific position on the element 506 that the user wishes to edit. User interface attribute database 508 stores attribute available to the multiple elements 530 that can be edited by the user. Filtering module 516 filters through user interface attribute database 508 and pulls out subset of attributes 532 that are specific attributes corresponding to the position on the element 512 selected by the user.

Palette display module 520 displays lightweight floating palette 518 in main document window 108. Subset of attributes 532 may be displayed in a lightweight floating palette 518 where the lightweight floating palette 518 may be displayed in the main document window by the palette display module 520. Display module 522 displays lightweight floating palette close proximity to the selected element 524 in the main document window 108. In one embodiment, the lightweight floating palette 518 may be displayed by the display module 522 in close proximity to where the user clicked on the element 506 that specifies the position on the element 512.

In an embodiment, the display module 522 displays all of the attributes stored in user interface attribute database 508 in a second main document view of the user interface computer system 502 while the lightweight floating palette 518 and the element 506 are displayed in main document window 108 of user interface computer system 502. Subset of attributes 528 for position on the element 512 may be stored in a subset of attribute database 528. In an embodiment, the display module 522 displays all of the attributes stored in user interface attribute database 508 in lightweight floating palette 518 where lightweight floating palette may be placed in close proximity to the selected element 524.

Modules may be used by user interface computing device 502. As referred to herein, a module may be any type of processing (or computing) device having one or more processors. For example, a module can be a workstation, mobile device, computer, cluster of computers, set-top box, or other device having at least one processor. In an embodiment, multiple modules may be implemented on the same processing device. Such a processing device may include software, firmware, hardware, or a combination thereof. Software may include one or more applications and an operating system. Hardware can include, but may not be limited to, a processor, memory, and/or graphical user interface display.

Method 600

This section and FIG. 6 summarizes one of the techniques described herein by presenting a flowchart of an exemplary method 600 of filtering attributes. While, method 600 is described with respect to an embodiment of the present invention, method 600 is not meant to be limiting and may be used in other applications.

As shown in FIG. 6, an embodiment of method 600 begins at step 610 where element may be displayed in main document window. In an embodiment, as shown in FIG. 1B, main document window 108 displays element 104. Once step 610 is complete, method 600 proceeds to step 620.

At step 620, attributes for an element are identified. In an embodiment, as shown in FIG. 1B, a selection from the user may be received by the user specifying position 120 on element 104. Based on the selection received, subset of attributes 110 can be identified for position 120 on element 104. Once step 620 is complete, method 600 proceeds to step 630.

At step 630, element attributes are distinguished from user interface attributes. In an embodiment as shown in FIG. 1B, subset of attributes 110 specific to position 120 on element 104 are distinguished from plurality of attributes 114 A-N which encompass every attribute made available by CAD interface 150. Once step 630 is complete, method 600 proceeds to step 640.

At step 640, element attributes are filtered from user interface attributes. In an embodiment as shown in FIG. 1B, subset of attributes 110 specific to position 120 on element 104 are filtered from plurality of attributes 114 A-N. Once step 640 is complete, method 600 proceeds to step 650.

At step 650, element attributes are displayed in a lightweight floating palette. In an embodiment as shown in FIG. 1B, subset of attributes 110 specific to position 120 on element 104 are displayed in lightweight floating palette 152 and made available to the user to edit. Once step 650 is complete, method 600 proceeds to step 660.

At step 660, a palette may be displayed in close proximity to the selected element. In an embodiment as shown in FIG. 1B, lightweight floating palette 152 may be displayed in close proximity to position 120 selected by the user on the element 104. When step 660 is completed, method 600 ends.

Embodiments can work with software, hardware, and/or operating system implementations other than those described herein. Any software, hardware, and operating system implementations suitable for performing the functions described herein can be used. Embodiments are applicable to both a client and to a server or a combination of both.

CONCLUSION

The Brief Summary and Abstract sections may set forth one or more but not all exemplary embodiments as contemplated by the inventors, and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A computer-implemented method for providing a user interface to edit a design including a design element having a plurality of attributes, each attribute of the plurality of attributes having at least one corresponding value, the method comprising:
    displaying the design element in a first view of the user interface;
    displaying a plurality of user interface attributes in an attribute menu of the user interface, the plurality of user interface attributes including the plurality of attributes specific to the displayed design element and other attributes specific to at least one other displayed design element;
    receiving a first selection associated with a first position on the design element;
    filtering the plurality of user interface attributes in the attribute menu based on the first position on the design element to determine a first subset of attributes, wherein the first subset of attributes is specific to the first position on the design element;
    displaying, in the attributes menu, the first subset of attributes having at least one value for editing a configuration specific to the first position of the design element;
    displaying the first subset of attributes in a first palette positioned in the first view according to the first position specified on the design element, wherein the first palette is located closer to the first position relative to a main document window of the user interface;
    receiving a second selection associated with a second position on the design element, wherein the second position is different from the first position;
    filtering the plurality of user interface attributes in the attribute menu based on the second position on the design element to determine a second subset of attributes, wherein the second subset of attributes is specific to the second position on the design element;
    displaying, in the attribute menu, the second subset of attributes having at least one value for editing a configuration specific to the second position of the design element, wherein the second subset of attributes is different from the first subset of attributes; and
    displaying the second subset of attributes in a second palette positioned in the first view according to the second position specified on the design element, wherein the second palette is located closer to the second position relative to the main document window of the user interface, and wherein the first palette is located in a position that is different from a location of the second palette.

2. The method of claim 1, wherein at least one of the first and second palettes is a lightweight floating palette.

3. The method of claim 1, wherein the first selection specifies the first position on the design element where a user clicked the design element, wherein the first palette displaying the first subset of attributes for the first position on the design element appears in close proximity to the first position on the design element.

4. The method of claim 1, wherein a plurality of elements is displayed in the first view of the user interface where the first selection from a user specifies the first position on the design element from a plurality of design elements.

5. The method of claim 1, wherein the plurality of attributes is displayed in a second view of the user interface, the second view different from the first view.

6. The method of claim 1, wherein the design element includes at least one of a line with arrowheads, an ellipse, a polyline, a Bezier curve, an image, a 3D model, or a text block.

7. The method of claim 1, wherein the design element includes a line.

8. The method of claim 1, wherein the received selection specifying the first position on the design element corresponds to at least one of a start position, an end position, a mid-point position, an interior position, a corner position, or a perimeter position of the design element.

9. The method of claim 8, wherein the first subset of attributes specific to the selected first position on the design element includes at least one of a stroke, an enable, a color, a dash pattern, a corner style, a path type, an arrowhead, an end cap, a fill enable, or a stroke enable.

10. The method of claim 1, wherein the first subset of attributes based on the first position on the design element is brightened and a plurality of user interface attributes that are not part of the first subset of attributes are darkened.

11. The method of claim 1, wherein the first and second palettes are not displayed at the same time.

12. The method of claim 1, further including receiving an indication that at least one attribute specific to the first position on the design element should not be included in the first subset of attributes.

13. A system for providing a user interface to edit a design including at least one design element having a plurality of attributes, wherein each attribute in the plurality of attributes includes at least one corresponding value, the system comprising:
    a receiving module that receives a first selection and a second selection from a user, the first selection specifying a first position on the at least one design element and the second selection specifying a second position on the at least one design element;
    a filtering module that filters the plurality of attributes for the at least one design element based on the first position on the at least one design element selected by the user to determine a first subset of attributes, the first subset of attributes being specific to the first position on the at least one design element selected by the user, wherein the filtering module further filters the plurality of attributes for the at least one design element based on the second position on the at least one design element selected by the user to determine a second subset of attributes, the second subset of attributes being specific to the second position on the at least one design element selected by the user; and a display module that displays the at least one design element in a first view of the user interface and displays the first subset of attributes in an attribute menu of the user interface, wherein the display module displays the first subset of attributes in a first palette positioned in the first view according to the first position specified on the at least one design element to enable the user to edit values corresponding to the first subset of attributes, and upon the receiving module receiving the second selection, the display module displays the second subset of attributes in the attribute menu and in a second palette positioned in the first view according to the second position specified on the user selected design element to enable the user to edit the values corresponding to the second subset of attributes, wherein the first palette is located closer to the first position relative to a main document window of the user interface, wherein the second palette is located closer to the second position relative to the main document window of the user interface, and wherein the first palette is located in a position that is different from a location of the second palette.

14. The system of claim 13, wherein the display module displays the first subset of attributes in the first palette located in a close proximity to the first position on the at least one design element selected by the user.

15. The system of claim 13, wherein the display module displays the first subset of attributes in the first palette that is a lightweight floating palette.

16. The system of claim 13, wherein the receiving module receives the first selection from the user that specifies the first position on the at least one design element by a click on the at least one design element where the first palette appears in close proximity to the first position on the at least one design element.

17. The system of claim 13, wherein the display module displays the plurality of attributes in a second view of the user interface, the second view different from the first view.

* * * * *